United States Patent
Yoshida et al.

(10) Patent No.: US 6,501,115 B2
(45) Date of Patent: *Dec. 31, 2002

(54) SEMICONDUCTOR INTEGRATED CIRCUIT DEVICE AND PROCESS FOR MANUFACTURING THE SAME

(75) Inventors: Makoto Yoshida, Ome (JP); Katsuyuki Asaka, Ome (JP); Toshihiko Takakura, Tachikawa (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/988,586

(22) Filed: Nov. 20, 2001

(65) Prior Publication Data

US 2002/0030213 A1 Mar. 14, 2002

Related U.S. Application Data

(63) Continuation of application No. 09/479,592, filed on Jan. 7, 2000, now Pat. No. 6,329,680.

(30) Foreign Application Priority Data

Jan. 7, 1999 (JP) ............................................. 11-001570

(51) Int. Cl.$^7$ .............................................. H01L 29/76
(52) U.S. Cl. ..................... 257/296; 257/204; 257/288; 257/296; 257/300; 257/350; 257/382; 257/383; 257/384; 257/774; 438/128; 438/129; 438/197; 438/250; 438/300
(58) Field of Search ................................ 257/284, 288, 257/296, 300, 350, 382, 383, 384, 774; 438/128, 129, 197, 250, 300

(56) References Cited

U.S. PATENT DOCUMENTS

| | | | | |
|---|---|---|---|---|
| 4,937,645 A | * | 6/1990 | Ootsuka et al. | 357/42 |
| 5,081,515 A | * | 1/1992 | Murata et al. | 357/42 |
| 5,237,187 A | | 8/1993 | Suwanai et al. | 257/296 |
| 6,020,643 A | | 2/2000 | Fukuzumi et al. | 257/774 |
| 6,066,881 A | | 5/2000 | Shimizu et al. | 257/392 |
| 6,078,072 A | | 6/2000 | Okudaira et al. | 257/295 |
| 6,194,757 B1 | | 2/2001 | Shinkawata | 257/306 |
| 6,329,680 B1 | * | 12/2001 | Yoshida et al. | 257/296 |

FOREIGN PATENT DOCUMENTS

JP 10-275910 10/1998

* cited by examiner

*Primary Examiner*—Allan R. Wilson
*Assistant Examiner*—Edgardo Ortiz
(74) *Attorney, Agent, or Firm*—Antonelli, Terry, Stout, & Kraus, LLP

(57) ABSTRACT

A plurality of first contact holes reaching an n$^+$-type semiconductor area used as the source of a MISFET employed in a logic-DRAM mixture LSI and a plurality of second contact holes reaching another n$^+$-type semiconductor area used as the drain of the MISFET are bored through an insulation layer created over a gate electrode of the MISFET. A conductive film on the same layer as a bit line shunts the n$^+$-type semiconductor area used as the source through the first contact holes. Another conductive film shunts the n$^+$-type semiconductor area used as the drain through the second contact holes.

4 Claims, 4 Drawing Sheets

SEMICONDUCTOR INTEGRATED CIRCUIT DEVICE AND PROCESS FOR MANUFACTURING THE SAME

This is a continuation of application Ser. No. 09/479,592, filed Jan. 7, 2000 now U.S. Pat. No. 6,329,680, the entire disclosure of which are hereby incorporated by reference.

FIELD OF THE INVENTION

In general, the present invention relates to a semiconductor integrated circuit device and a process for manufacturing the same. More particularly, the present invention relates to an effective process which is applicable to a logic-DRAM (Dynamic Random Access Memory) mixture semiconductor integrated circuit device.

BACKGROUND OF THE INVENTION

In a logic-DRAM mixture LSI (Large Scale Integrated Circuit), since the wiring resistance of a logic portion has a big effect on the operating speed of the circuit, a metallic film having a low resistance is used as a wiring material. Examples of such a metallic film are an aluminum (Al) alloy film and a copper (Cu) film. The thickness of the wiring film is typically in the range 0.5 to 1.0 pm and the sheet resistance is in the range 35 to 70 mΩ/□.

However, restrictions imposed by the fabrication processes, such as the photographic resolution and the etching controllability impose a lower limit on wiring gaps and an upper limit on the number of lines. Thus, even if a plurality of lines $M_1$, $M_2$, and $M_3$, are provided on the semiconductor areas constituting a source and a drain of a MISFET (Metal Insulator Semiconductor Field Effect Transistor), only one contact hole 67 can be created in each semiconductor area serving as the source and each semiconductor area serving as the drain in some cases, as shown in FIG. 7. Thus, deterioration of the operating characteristics of the MISFET, such as a decreased drain current caused by a parasitic drain-source resistance, raises a concern. For this reason, the surfaces of the semiconductor areas constituting the source and the drain are silicided to reduce the parasitic drain-source resistance.

It should be noted that a MISFET wherein the surfaces of the semiconductor areas thereof constituting the source and the drain are silicided is described for example in Semiconductor World, a publication issued by Press Journal Corporation, the edition of December 1995, pages 150 to 151.

SUMMARY OF THE INVENTION

In a logic-DRAM mixture LSI, after a MISFET of the logic portion has been formed, a capacitive element of the DRAM portion for storing information is created. For this reason, due to a heat-treatment process carried out on the semiconductor substrate in the process of creating the capacitive element of the DRAM portion for storing information, a chemical reaction of a silicide layer will proceed on the surfaces constituting the source and the drain of the MISFET of the logic portion. As a result, it is quite within the bounds of possibility that problems, such as peeling off of the silicide layer, increased source-drain sheet resistance and increased junction leakage between the source and the drain, will arise.

In addition, since a silicide layer is formed by a chemical reaction of a metal, such as a titan (Ti) film or a cobalt (Co) film and silicon comprising a semiconductor substrate, the matching of a shallow junction between the source and the drain is poor in spite of the fact that good matching is absolutely required for increasing the performance of the MISFET. There is a conceivable method to improve the matching whereby the thickness of the silicide layer is reduced. However, this method will raise a problem of an increased source-drain parasitic resistance.

It is thus an object of the present invention to provide a technology that is capable of preventing the operating characteristic of a semiconductor integrated circuit device from deteriorating by reducing the parasitic resistance of a MISFET of the device.

Other objects and characteristics of the present invention will become apparent from the following description of the present invention when taken with reference to the accompanying drawings.

Overviews of representative aspects of the present invention, as disclosed in this specification will be described briefly as follows:

(1) In the logic portion of the logic-DRAM mixture of the semiconductor integrated circuit device provided by the present invention, a plurality of first contact holes reaching a semiconductor area used as a source of a MISFET and a plurality of second contact holes reaching a semiconductor area used as a drain of the MISFET are bored through an insulation layer created over a gate electrode of the MISFET, the semiconductor area used as the source is shunted through the first contact holes by first conductive films on the same layer as bit lines and the semiconductor area used as the drain is shunted through the second contact holes by second conductive films also on the same layer as the bit lines.

(2) According to a method of fabricating a logic-DRAM mixture semiconductor integrated circuit device provided by the present invention, in a process to create a MISFET of a logic portion of the device, first of all, after the creation of the MISFET including a pair of a source and a drain formed to comprise a gate insulation film, a gate electrode and a semiconductor area created on the main surface of a semiconductor substrate, a first insulation layer is created over the MISFET. Then, after a plurality of first contact holes reaching a semiconductor area used as a source and a plurality of second contact holes reaching a semiconductor area used as a drain are bored through the first insulation layer, plugs are created through the first and second contact holes. Subsequently, the semiconductor area used as the source is shunted through the plugs inside the first contact holes by first conductive films on the same layer as bit lines and the semiconductor area used as the drain is shunted through the plugs inside the second contact holes by second conductive films also on the same layer as the bit lines. Then, after a second insulation layer has been created over the bit lines, a first through hole reaching the first conductive film and a second through hole reaching the second conductive film are bored through the second insulation layer. Finally, plugs are created through the first and second through holes, and an upper wiring layer is then formed.

According to the features described above, a semiconductor area used as the source of a MISFET is shunted through first contact holes by first conductive films on the same layer as bit lines and, by the same token, a semiconductor area used as the drain of the MISFET is shunted through second contact holes by second conductive films also on the same layer as the bit lines. Thus, most of the drain current of the MISFET flows through the shunting first and second conductive films, reducing the source-drain parasitic resistance. As a result, the operating characteristics of the MISFET can be prevented from deteriorating. In addition, since the parasitic resistance can be reduced, it is possible to eliminate a process to create a silicide layer on the surfaces of the semiconductor areas used as the source and the drain and, hence, to make the fabrication process simpler.

BRIEF DESCRIPTION OF THE DRAWINGS

FIG. 4($b$) is a diagram showing an equivalent circuit of the source-drain parasitic resistance of the conventional MISFET;

DESCRIPTION OF THE PREFERED EMBODIMENTS

Figure 1:
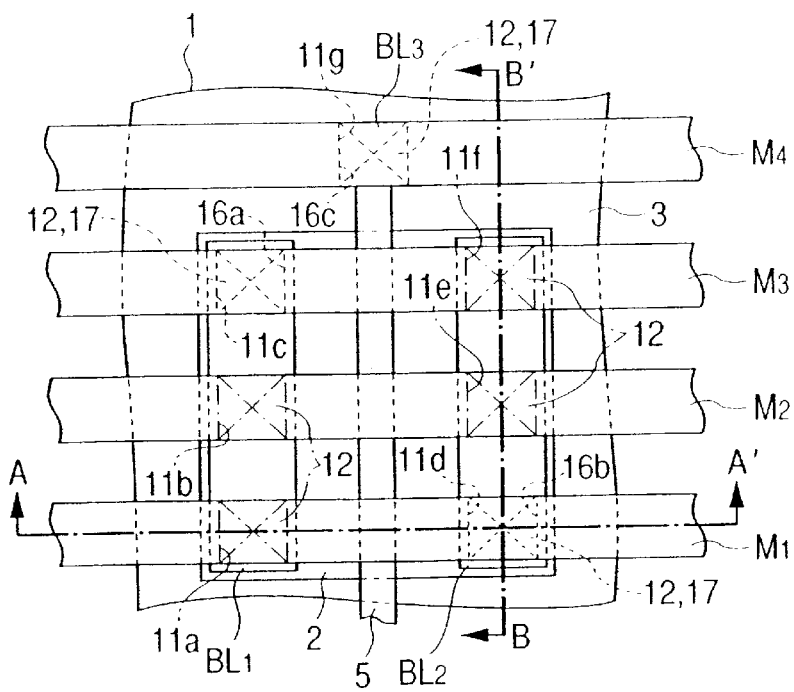
FIG. 1 is a diagram showing a top view of main elements of a MISFET on a semiconductor substrate as implemented by an embodiment of the present invention.

Some preferred embodiments of the present invention will be explained in detail with reference to the accompanying drawings as follows.

It should be noted that elements having identical functions are denoted by the same reference numerals throughout the figures and they are each explained only once.

First Embodiment

Figure 2:
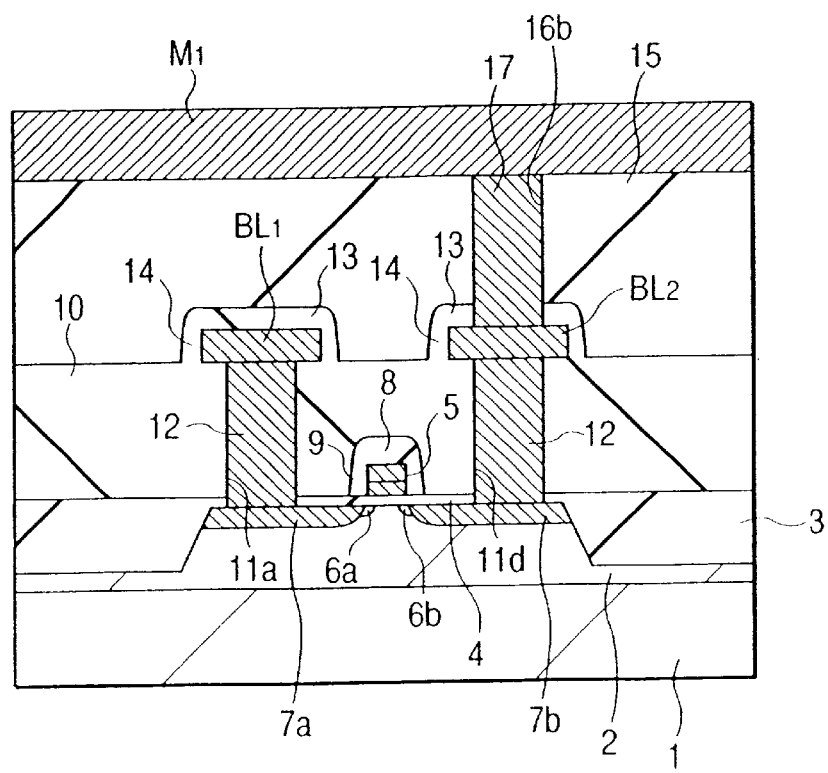
FIG. 2 is a cross-sectional diagram showing the main elements of the MISFET along a line A–A' shown in FIG. 1.
Figure 3:
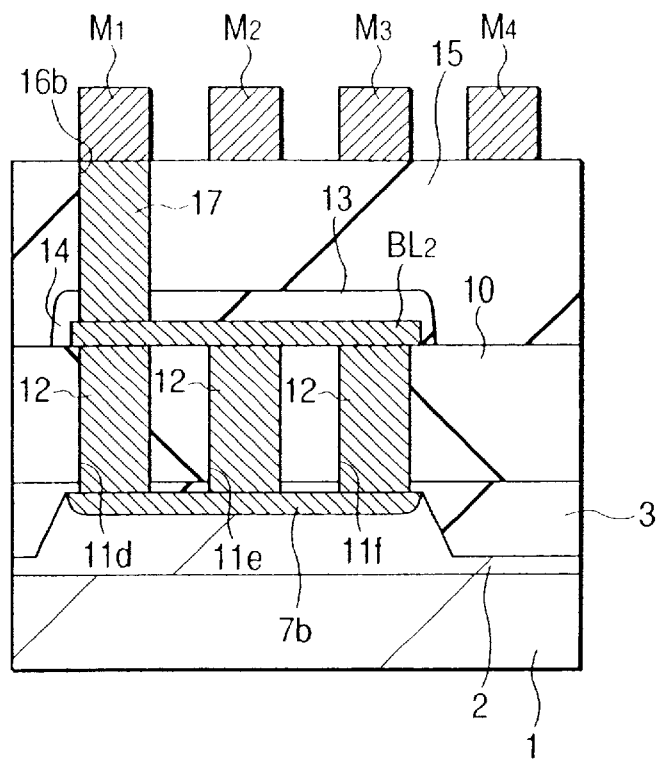
FIG. 3 is a cross-sectional diagram showing the main elements of the MISFET along a line B–B' shown in FIG. 1.

FIG. 1 is a diagram showing a top view of main elements of a semiconductor substrate for creating an n-channel MISFET of a logic portion of a semiconductor integrated circuit device as implemented by an embodiment of the present invention FIG. 2 is a cross-sectional diagram showing the main elements of the semiconductor substrate along a line A–A' shown in FIG. 1. FIG. 3 is a cross-sectional diagram showing the main elements of the semiconductor substrate along a line B–B' shown in FIG. 1.

On the main surface of the semiconductor substrate I made of a p-type silicon monolithic crystal, a p-type well 2 is created. On the main surface of a passive area of this p-type well 2, a separation area 3 is formed. The n-channel MISFET is created on the main surface of an active area of the p-type well 2 enclosed by the separation area 3.

The n-channel MISFET includes a gate oxide film 4, a gate electrode 5 and a pair of a source and a drain which comprise $n^-$-type semiconductor areas 6$a$ and 6$b$ and $n^+$-type semiconductor areas 7$a$ and 7$b$. The gate electrode 5 has a sequentially stacked structure comprising a polycrystalline silicon film doped with an n-type impurity material such as phosphor (P) and a tungsten silicide ($WSi_2$) film.

An insulation film 8 is created over the gate electrode 5 which is typically comprised of a silicon-nitride film in addition, on a side wall of the gate electrode 5 extended in the longitudinal direction of the gate electrode 5, a sidewall spacer 9 is created. The side-wall spacer 9 is typically made of a silicon-nitride film.

An insulation layer 10 is created over the insulation layer 8 and the side-wall spacer 9. The insulation layer 10 is a multi-layer film implemented typically by a silicon-nitride film or a silicon-oxide film. A plurality of first contact holes 11$a$ to 11$c$ reaching the $n^+$-type semiconductor area 7$a$ used as a portion of the source, a plurality of second contact holes 11$d$ to 11$f$ reaching the $n^+$-type semiconductor area 7$b$ used as a portion of the drain and a contact hole 11$g$ reaching the gate electrode 5 are bored through the insulation layer 10. Plugs 12 are then created inside the holes 11$a$ to 11$g$. The plugs 12 typically are each made of a tungsten (W) film, a titan-nitride (TiN) film or a titan (Ti) film.

As shown in FIG. 1, the first contact holes 11$a$ to 11$c$ and the second contact holes 11$d$ to 11$f$ are laid out at a pitch equal to a pitch of a first layer line created in a later process. It should be noted, however, that the first contact holes 11$a$ to 11$c$ and the second contact holes 11$d$ to 11$f$ are laid out at a pitch smaller than the pitch of the first layer line.

Conductive films $BL_1$ to $BL_3$ on the same layer as the bit lines are created over the insulation layer 10. The conductive film $BL_1$ is connected to the $n^+$-type semiconductor area 7$a$ forming a portion of the source through the first contact holes 11$a$ to 11$c$ and, at the same time, shunts the $n^+$-type semiconductor area 7$a$ forming the portion of the source through plugs 12 inside the first contact holes 11$a$ to 11$c$. The conductive film $BL_2$ is connected to the $n^+$-type semiconductor area 7$b$ forming a portion of the drain through the second contact holes 11$d$ to 11$f$ and, at the same time, shunts the $n^+$-type semiconductor area 7$b$ forming the portion of the drain through plugs 12 inside the second contact holes 11$d$ to 11$f$. The conductive film $BL_3$ is connected to the gate electrode 5 through a plug 12 inside the contact hole 11$g$. The conductive films $BL_1$ to $BL_3$ are each implemented by a metallic film having a high fusion point such as a tungsten (W) film.

An insulation film 13 is created over the conductive films $BL_1$ to $BL_3$. On side walls of the conductive films $BL_1$ to $BL_3$, side-wall spacers 14 are created. The insulation film 13 and the side-wall spacers 14 are typically made of a silicon-nitride film.

An insulation layer 15 is created over the insulation film 13 and the side-wall spacers 14. The insulation layer 15 is a multi-layer film implemented typically by a silicon-nitride film or a silicon-oxide film. A through hole 16$a$ reaching the conductive film $BL_1$ a through hole 16$b$ reaching the conductive film $BL_2$ and a through hole 16$c$ reaching the conductive film $BL_3$ are bored through the insulation layer 15. Plugs 17 are created inside the through holes 16$a$, 16$b$ and 16$c$. The plugs 17 typically are each made of a tungsten (W) film, a titan-nitride (TiN) film or a titan (Ti) film.

First layer lines $M_1$, to $M_4$, which extend in a direction perpendicular to the gate electrode 5, are created over the insulation layer 15. The first layer lines $M_1$ to $M_4$, are laid out at equal pitches. The first layer line $M_1$, is connected to the conductive film $BL_2$ through the through hole 16$b$. The first layer line $M_3$, is connected to the conductive film $BL_1$, through the through hole 16a. The first layer line $M_4$, is connected to the conductive film $BL_3$ through the through hole 16c.

As described above, in the first embodiment, the conductive film $BL_1$ comprised of a film with a high fusion point such as a tungsten (W) film shunts the $n^+$-type semiconductor area 7a forming the portion of the source of the n-channel MISFET through the plugs 12 inside the first contact holes 11a to 11c Similarly, the conductive film $BL_2$ comprised of a film with a-high fusion point shunts the $n^+$-type semiconductor area 7b forming the portion of the drain of the n-channel MISFET through the plugs 12 inside the second contact holes 11d to 11f. Thus, since most of a drain current flows through the shunting conductive films $BL_1$ and $BL_2$ the source-drain parasitic resistance is reduced, making it possible to prevent the operating characteristic of the MISFET from deteriorating due to the parasitic resistance. In addition, since the source-drain parasitic resistance can be reduced, it is possible to eliminate a process of creating a silicide layer on the surface of the $n^+$-type semiconductor area 7a forming the portion of the source and the $n^+$-type semiconductor area 7b forming the portion of the drain. As a result, the fabrication process can be made simpler.

It should be noted that the conductive layers $BL_1$ to $BL_3$ can be each implemented by polycide films made by sequentially stacking a polycrystalline silicon film and a metallic film with a high fusion point.

Figure 4A:
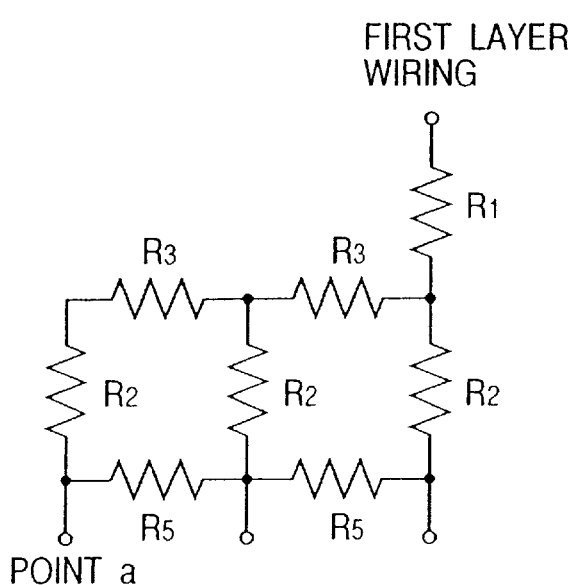
FIG. 4($a$) is a diagram showing an equivalent circuit of the source-drain parasitic resistance of a MISFET implemented by the embodiment of the present invention.
Figure 4B:
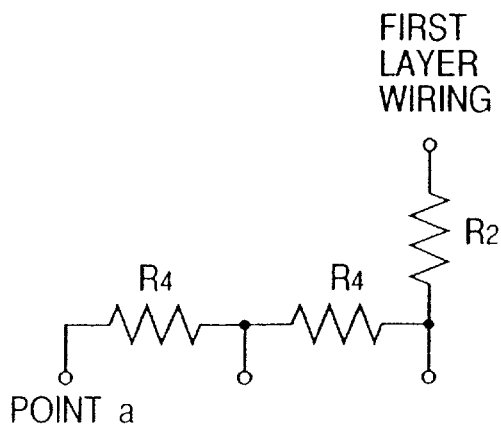

FIGS. 4(a) and 4(b) are diagrams showing an equivalent circuit of the source-drain resistance of a MISFET. To be more specific, FIG. 4(a) is a diagram showing the resistance circuit (distributed constant circuit) of the MISFET implemented by the first embodiment. On the other hand, FIG. 4(b) is a diagram showing the resistance circuit (distributed constant circuit) of the conventional MISFET.

In the figure, a resistor $R_1$ with a resistance of $3\Omega$ is a series resistor connected between the first layer line and a conductive film on the same layer as a bit line. A resistor $R_2$ with a resistance of $2\Omega$ is a series resistor connected between the conductive film on the same layer as the bit line and the source and the drain. A resistor $R_3$ with a resistance of $1\Omega$ is a sheet resistor of the conductive film on the same layer as the bit line. Resistors $R_4$ with a resistance of $10\Omega$ are sheet resistors of the source and the drain each having a sulicide layer. Resistors $R_5$ with a resistance of $50\Omega$ are sheet resistors of the source and the drain each having no sulicide layer.

The parasitic resistance of the conventional MISFET, that is, a resistance between point a and the first layer line shown in FIG. 4(b) is $22\Omega$ ($=R_4+2+R_2$). On the other hand, the parasitic resistance of the MISFET implemented by the first embodiment is $7\Omega$ ($=R_2+R_3*2+R_1$) which is about one-third of that of the conventional MISFET.

Figure 7:
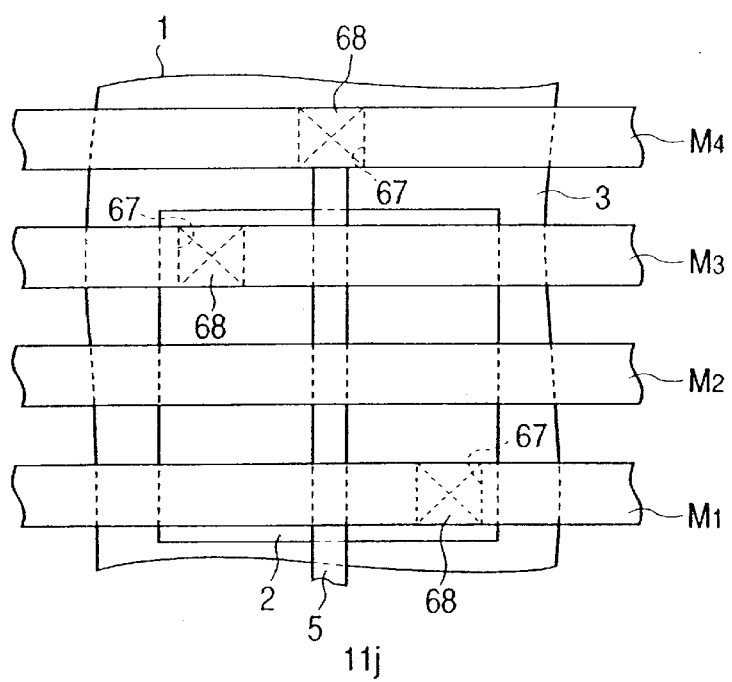
FIG. 7 is a diagram showing a top view of main elements on a semiconductor substrate of a MISFET studied by the inventor of the present invention.

As described above, it is obvious from FIG. 1 that, in comparison with the plugs 68 shown in FIG. 7 and the plug 17 connected to the first layer line M, as shown in FIG. 1, a plurality of plugs 12 as a whole have a large cross-sectional area on the planar layout and are connected to an area wider than the $n^+$-type semiconductor layer. In addition, the plugs 12 are electrically connected to each other by the conductive films $BL_1$ and $BL_2$. Thus the apparent parasitic resistance of the device is reduced.

Figure 5:
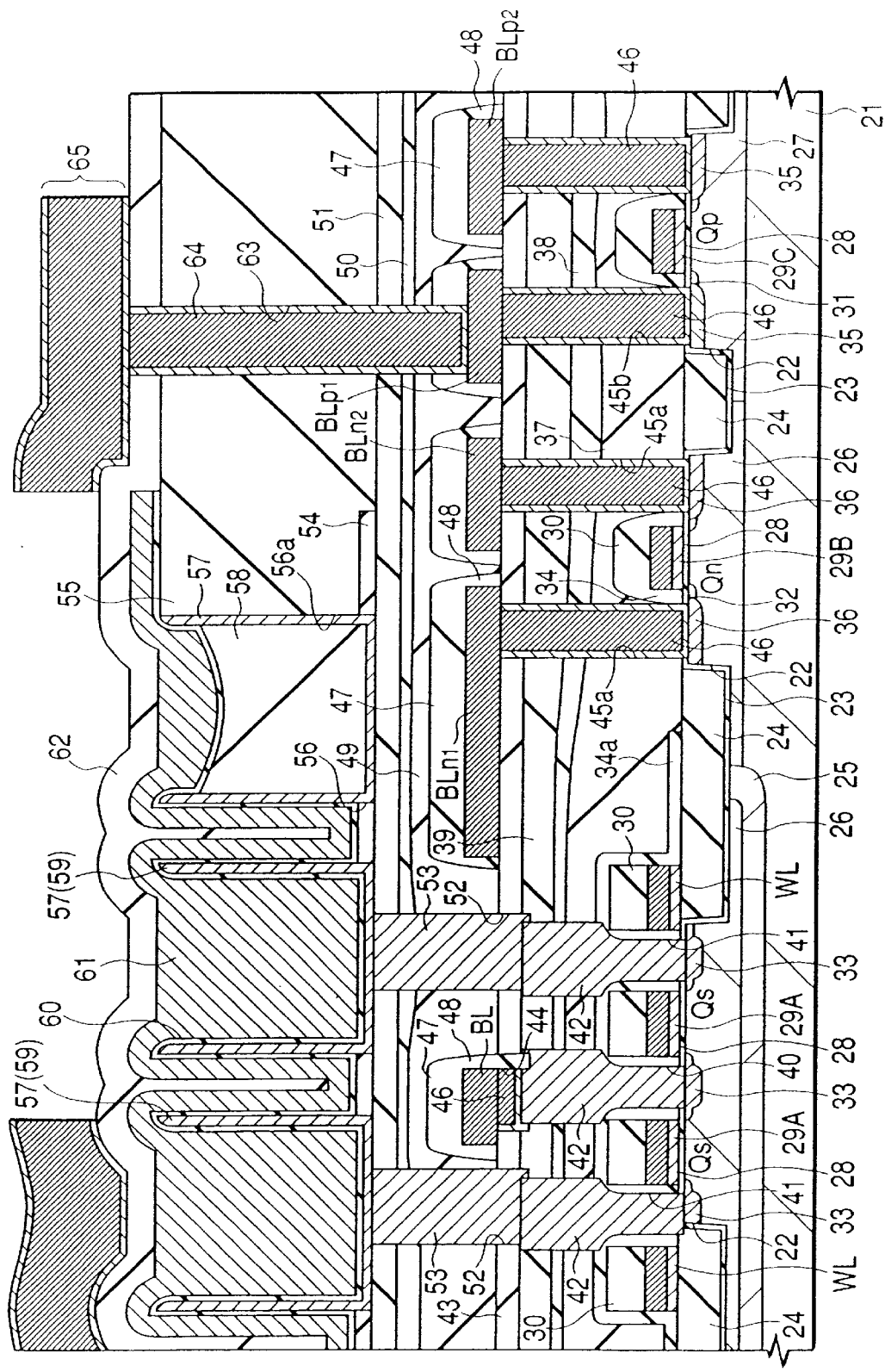
FIG. 5 is a cross-sectional diagram of main elements on a semiconductor substrate showing a method of fabricating a logic-DRAM mixture LSI implemented by the embodiment of the present invention.

The following description is directed to a method of fabricating a logic-DRAM mixture LSI adopting a wiring structure implemented by an embodiment of the present invention in a process order by referring to a cross section shown in FIG. 5.

First of all, a p-type semiconductor substrate 21 is prepared. A groove 22 with a depth in the range of approximately 0.3 to 0.4 μm is then formed on the main surface of the semiconductor substrate 21. Then, a thermal oxidation process is carried out on the semiconductor substrate 21 to create a silicon-oxide film 23. After that, a silicon-oxide film is deposited on the semiconductor substrate 21. Subsequently, the surface of the silicon-oxide film is flattened by adopting a CMP (Chemical Mechanical Polishing) technique to form a separation area 24, leaving a silicon-oxide film only inside the shallow groove 22.

Then, an n-type semiconductor area 25 is formed by ion implantation of an n-type impurity material such as phosphor (P) on the semiconductor substrate 21 of the DRAM portion Subsequently, a p-type semiconductor area 26 is formed by ion implantation of a p-type impurity material such as boron (B) on parts of the DRAM and logic portions such as a part for creating a p-channel MISFET. An n-type semiconductor area 27 is then formed by ion implantation of an n-type impurity material such as phosphor (P) on a part of the logic portion such as a part for creating an n-channel MISFET. Following these ion implantations, ion implantation of an impurity material for adjusting a threshold voltage of the MISFET is carried out on the p-type well 26 and the n-type well 27. An example of such an impurity material is boron fluoride (BF2).

Then, the surfaces of the p-type well 26 and the n-type well 27 are cleaned by using an aqueous solution of the hydrofluoric-acid HF group before wet oxidation of the semiconductor substrate 21 at about 850° C. to create a clean gate oxide film 28 with a thickness of about 7 nm on the surfaces of the p-type well 26 and the n-type well 27.

Subsequently, gate electrodes 29A, 29B and 29C are created over the gate oxide film 28. The gate electrode 29A forms a portion of a MISFET Qs for selecting a memory cell. In regions other than an active area, the gate electrode 29A functions as a word line WL. The gate electrodes 29B and 29C form portions of an n-channel MISFET and a p-channel MISFET of the logic unit respectively.

The gate electrode 29A (or the word line WL) and the gate electrodes 29B and 29C are formed by carrying out processes of: depositing a polycrystalline silicon film with a thickness of about 50 nm doped with an n-type impurity material such as phosphor (P) on the semiconductor substrate 21 by adopting a CVD (Chemical Vapor Deposition) technique, depositing a tungsten silicide ($WSi_2$) film with a thickness of about 120 nm over the polycrystalline silicon film by adopting a sputtering technique; depositing a silicon-nitride film 30 with a thickness of about 200 nm over the $WSi_2$ film by adopting the CVD technique; and patterning these films by using a photoresist film as a mask.

Then, after the photoresist film has been removed, dry-etching remnants and photoresist remnants left on the surface of the semiconductor substrate 21 are cleaned by using an etching liquid such as fluorine. Subsequently, $p^-$-type semiconductor areas 31 are formed on the n-type wells 27 on both sides of the gate electrode 29C by ion implantation of a p-type impurity material such as boron (B) on the n-type well 27. Then, $n^-$-type semiconductor areas 32 are formed on the p-type wells 26 on both sides of the gate electrode 29B and n-type semiconductor areas 33 are formed on the p-type wells 26 on both sides of the gate electrode 29A by ion implantation of an n-type impurity material such as phosphor (P) on the p-type well 26. As a result, a MISFET Qs for selecting a memory cell in a memory array is created.

After a silicon-nitride film 34a with a thickness of about 50 nm has been deposited on the semiconductor substrate 21 by adopting the CVD method, the silicon-nitride film 34a is covered by a photoresist film and, by carrying out anisotropic etching on the silicon-nitride film 34a of the logic portion, sidewall spacers 34 are created on side walls of the gate electrodes 29B and 29C.

Next, after the photoresist film has been removed, a $p^+$-type semiconductor area 35 for the source and the drain of a p-channel MISFET Qp is created by ion implantation of a p-type impurity material such as boron (B) on the n-type well 27 of the logic portion, and an $n^+$-type semiconductor area 36 for the source and the drain of an n-channel MISFET Qn is created by ion implantation of an n-type impurity material such as arsenic (As) on the p-type well 26 of the logic portion. As a result, the p-channel MISFET Qp and the n-channel MISFET Qn are created on the logic portion.

Then, after carrying out a spin coating process of an SOG (Spin On Glass) film 37 with a thickness of about 300 nm on the semiconductor substrate 21, the semiconductor substrate 21 is subjected to a heat-treatment process at 800° C. for about 1 minute for sintering the SOG film 37.

Then, after a silicon-oxide film 38 with a thickness of about 400 nm is deposited over the SOG film 37, the silicon-oxide film 38 is ground by adopting the CMP method to flatten the surface thereof. The silicon-oxide film 38 is deposited by adopting the plasma CVD method using typically ozone ($O_3$) and tetraethoxyline (TEOS) in a source gas.

Then, a silicon-oxide film 39 with a thickness of about 100 nm is deposited over the silicon-oxide film 38. The silicon-oxide film 39 is deposited to compensate the surface of the silicon-oxide film 38 for infinitesimal injuries inflicted thereon by the grinding process adopting the Cmp method. The silicon-oxide film 39 is deposited by adopting the CVD method using typically ozone ($O_3$) and tetraethoxyline (TEOS) in a source gas. In place of the silicon-oxide film 39, a PSG (Phosphor Silicate Glass) film can also be deposited over the silicon-oxide film 38.

Next, the silicon-oxide films 39 and 38 and the SOG film 37 over the n-type semiconductor area 33 for the source and the drain of the MISFET Qs for selecting a memory cell are eliminated by dry etching using a photoresist film as a mask. Subsequently, by eliminating the silicon-nitride film 34a and the gate oxide film 28 over the n-type semiconductor area 33 for the source and the drain of the MISFET Qn for selecting a memory cell, a contact hole 40 is formed over one side of the n-type semiconductor area 33 for the source and the drain, and a contact hole 41 is formed over the other side.

Then, after the photoresist film has been eliminated, plugs 42 are created inside the contact holes 40 and 41. The plugs 42 are created by depositing a polycrystalline silicon film doped with an n-type impurity material such as phosphor (P) over the silicon-oxide film 39 by using the CVD method and then polishing the polycrystalline silicon film by using the CMP method to leave the plugs 42 in the contact holes 40 and 41.

Then, after a silicon-oxide film 43 with a thickness of about 200 nm is deposited over the silicon-oxide film 39, the semiconductor substrate 21 is subjected to a heat-treatment process of about 800° C. The silicon-oxide film 43 is deposited by adopting the CVD method using typically ozone ($O_3$) and tetraethoxyline (TEOS) in a source gas. In the heat-treatment process, the n-type impurity material in the polycrystalline silicon film forming the plugs 42 spreads from the bottoms of the contact holes 40 and 41 to the n-type semiconductor area 33 for the source and the drain of the MISFET Qs for selecting a memory cell, reducing the resistance of the n-type semiconductor area 33.

Next, a dry-etching process using a photoresist film as a mask is carried out to remove the silicon-oxide film 43 over the contact hole 40 in order to form a contact hole 44, and the surfaces of the plugs 42 are exposed. Next, after the photoresist film has been removed, another photoresist film is formed. A dry-etching process using a photoresist film as a mask is then carried out to remove the gate-oxide film 28, the SOG film 37 and the silicon-oxide films 43, 39 and 38 of the logic portion in order to form a plurality of contact holes 45a over the $n^+$-type semiconductor area 36 for the source and the drain of the n-channel MISFET Qn as shown in FIG. 1. Similarly, a plurality of contact holes 45b are formed over the $p^+$-type semiconductor area 35 for the source and the drain of the p-channel MISFET Qp.

Next, after the photoresist film has been removed, plugs 46 are created inside the contact holes 44, 45a and 45b. The plugs 46 are formed by executing the processes of: depositing a titan (Ti) film with a thickness of about 50 nm and a titan-nitride (TiN) film with a thickness of about 50 nm over the silicon-oxide film 43 by adopting the sputtering method; depositing a tungsten (W) film with a thickness of about 150 nm over the titan (Ti) and titan-nitride (TiN) films by adopting the CVD method; and polishing the tungsten (W), titan (Ti) and titan-nitride (TiN) films by adopting the CMP method, thereby to leave the plugs 46 inside the contact holes 44, 45a and 45b.

Next, a bit line BL is created over the silicon-nitride film 43 of the DRAM portion. Then, conductive films $BLn_1$, $BLn_2$, $BLp_1$ and $BLp_2$ on the same layer as a bit line BL created over the silicon-nitride film 43 of the logic portion are created. The conductive films $BLn_1$ and $BLn_2$ shunt the $n^+$-semiconductor area 36 for the source and the drain of the n-channel MISFET Qn whereas the conductive films $BLp_1$ and $BLp_2$ shunt the $p^+$-semiconductor area 35 for the source and the drain of the p-channel MISFET Qp.

The bit line BL and the conductive films $BLn_1$, $BLn_2$, $BLp_1$ and $BLp_2$ are created by carrying out the processes of:

depositing typically a tungsten (W) film over the silicon-oxide film 43 by adopting the sputtering or CVD method;

depositing a silicon-nitride film 47 on the tungsten (W) film; and patterning the silicon-nitride film 47 and the tungsten (W) film with a photoresist film as a mask.

Next, after the photoresist film has been removed and a silicon-nitride film has been deposited over the silicon-nitride film 47, the silicon-nitride film is subjected to an anisotropic etching process to create side-wall spacers 48 on side walls of the bit line BL and the conductive films $BLn_1$ $BLn_2$, $BLp_1$ and $BLp_2$. Then, after a spin coating process of an SOG film 49 with a thickness of about 250 nm created over the silicon-nitride film 47, the semiconductor substrate 21 is subjected to a heat-treatment process of 800° C. for about 1 minute for sintering the SOG film 49. It should be noted that, if a through hole 52 to be described later is not formed in a state of self-matching the bit line BL, the side-wall spacers 48 and the silicon-nitride film 47 on the bit line BL can be omitted.

Then, after a silicon-oxide film 50 with a thickness of about 200 nm has been deposited over the SOG film 49, the silicon-oxide film 50 is polished to flatten the surface thereof by adoption of the CMP method. The silicon-oxide film 50 is deposited by adopting the CVD method using typically ozone ($O_3$) and tetraethoxyline (TEOS) in a source gas.

Then, a silicon-oxide film 51 with a thickness of about 100 nm is deposited over the silicon-oxide film 50. The silicon-oxide film 51 is deposited to compensate the surface of the silicon-oxide film 50 for infinitesimal injuries inflicted thereon by the polishing process adopting the CMP method. The silicon-oxide film 51 is deposited by adopting the CVD method using typically ozone ($O_3$) and tetraethoxyline (TEOS) in a source gas.

Then, the silicon-oxide films 51 and 50, the SOG film 49 and the silicon-oxide film 43 created over the plug 42 embedded in the contact hole 41 are removed by a dry-etching process using a photoresist film as a mask to form a through hole 52 reaching the surface of the plug 42 in a state of self-matching the bit line BL.

Next, after the photoresist film has been removed, a plug 53 is created inside the through hole 52. The plug 53 is created by depositing a polycrystalline silicon film doped with an n-type impurity material such as phosphor (P) over the silicon-oxide film 51 by using the CVD method and then etching the polycrystalline silicon film to leave the plug 53 in the contact hole 52.

Then, after a silicon-nitride film 54 with a thickness of about 200 nm has been deposited over the silicon-oxide film 51 by using the CVD method, the silicon-nitride film 54 is removed by a dry-etching process using a photoresist film as a mask. The silicon-nitride film 54 left in the DRAM portion is utilized as an etching stopper in etching a silicon-oxide film between lower-side electrodes in a process to create the lower-side electrodes of capacitive elements each used for storing information in a memory cell as will be described later.

Then, after the photo resist has been eliminated, a silicon-oxide film 55 with a thickness of about 1.3 $\mu$m is deposited over the silicon-nitride film 54, and the silicon-nitride film 54 and the silicon-oxide 55 are removed by a dry-etching process using a photoresist film as a mask to form a groove 56 over the through hole 52. At the same time, a groove 56a having the shape of a frame enclosing a memory array of the DRAM portion around the memory array. The silicon-oxide film 55 is deposited by adopting the CVD method using typically ozone ($O_3$) and tetraethoxyline (TEOS) in a source gas.

Then, after the photo resist has been eliminated, a polycrystalline silicon film 57 with a thickness of about 60 nm doped with an n-type impurity material such as phosphor (P) is deposited over the silicon-oxide film 55 by using the CVD method. The polycrystalline silicon film 57 is used as a material of the lower-side electrode of a capacitive element for storing information in a memory cell.

Then, after a spin coating process of an SOG film 58 with a thickness deeper than the grooves 56 and 56a over the polycrystalline silicon film 57, the SOG film 58 is etched back and the polycrystalline silicon film 57 created over the silicon-oxide film 55 is further etched back to leave a polycrystalline silicon film 57 on the inner side, that is, on the inner wall and the bottom, of the grooves 56 and 56a.

Then, by using the photoresist film covering the silicon-oxide film 55 of the logic portion as a mask, the silicon-oxide film 55 in a gap between the groove 56 and the SOG film 58 inside the groove 56 is subjected to a wet-etching process to form a lower-side electrode 59 of a capacitive element for storing information in a memory cell. Since a silicon-nitride film 54 is left in a gap of the groove 56 at that time, the silicon-oxide film 51 under the silicon-nitride film 54 cannot be etched.

Next, the photoresist film is removed and, then, in order to avoid oxidation of the polycrystalline silicon film 57 constituting the lower-side electrode 59, after the surface of the polycrystalline silicon film 57 has been nitrified by carrying out a heat-treatment process at about 800° C. on the semiconductor substrate 21 in an ammonia environment, a tantalum-oxide ($Ta_2O_5$) film 60 with a thickness of about 20 nm is deposited over the lower-side electrode 59 by adopting the CVD method. Then, the semiconductor substrate 21 is subjected to a heat-treatment process at about 800° C. to activate the tantalum-oxide ($Ta_2O_5$) film 60. The tantalum-oxide ($Ta_2O_5$) film 60 is used as a material of the lower-side electrode of a capacitive element for storing information in a memory cell.

Then, after a titan-nitride (TiN) film 61 with a thickness of about 150 nm has been deposited over the tantalum-oxide ($Ta_2O_5$) film 60 by adopting the CVD and sputtering methods, the titan-nitride (TiN) film 61 and the tantalum-oxide ($Ta_2O_5$) film 60 are patterned by a dry-etching process using a photoresist film as a mask to form a capacitive element. Serving as a means for storing information, the capacitive element has an upper electrode comprising the titan-nitride (TiN) film 61, a capacitor insulation film implemented by the tantalum-oxide ($Ta_2O_5$) film 60 and a lower-side electrode 59 implemented by the polycrystalline silicon film 57. At this point of time, the process to create a memory cell of the DRAM portion is completed. The memory cell includes the MISFET Qs for selecting a memory cell and the capacitive element used for storing information and connected in series to the MISFET Qs.

Then, after the photo resist has been eliminated, a silicon-oxide film 62 with a thickness of about 600 nm is deposited over the capacitive element for storing information in a memory cell. The silicon-oxide film 62 is deposited by the CVD method using typically ozone ($O_3$) and tetraethoxyline (TEOS) in a source gas. Then, the silicon-oxide films 62, 55, 51 and 50, the SOG film 49 and the silicon-nitride film 47 created over the bit lines $BLn_1$ $BLn_2$, $BLp_1$ and $BLp_2$ of the logic portion are removed by use of a dry-etching process using a photoresist film as a mask to form through holes 63 reaching the bit lines $BLn_1$ $BLn_2$, $BLp_1$ and $BLP_2$ respectively. It should be noted that the figure shows only the through hole 63 reaching the bit line $BLp_1$ above the p-channel MISFET Qp of the logic portion.

Next, after the photoresist film has been removed, a plug 64 is created inside the through hole 63 Then, a first layer line 65 is created over the silicon-oxide film 62. The plug 64 is created by depositing a titan-nitride (TiN) film with a thickness of about 100 nm over the silicon-oxide film 62 by using the CVD method and then further depositing a tungsten (W) film with a thickness of about 500 nm over the titan-nitride film by using the sputtering method; and, thereafter, these films are etched back to leave the plug 64 inside the through hole 63. The first layer line 65 is created by carrying out the processes of: sequentially depositing a titan-nitride (TiN) film with a thickness of about 50 nm, an aluminum (Al)-alloy film with a thickness of about 500 nm, a titan (Ti) film with a thickness of about 10 nm and a titan-nitride (TiN) film, one film after another over the silicon-oxide film 62; and patterning the titan-nitride (TiN) film, the aluminum (Al)-alloy film, the titan (Ti) film and the titan-nitride (TiN) film by adopting the dry-etching method using a photoresist film as a mask.

Later on, after an interlayer isolation film has been created, second layer lines are created over the first layer line 65. Then, a passivation film, which is not shown in the figure, is deposited over the second layer lines. At the end of the processes described above, the fabrication of the logic-DRAM mixture LSI implemented by the embodiment is all but completed.

Second Embodiment

Figure 6:
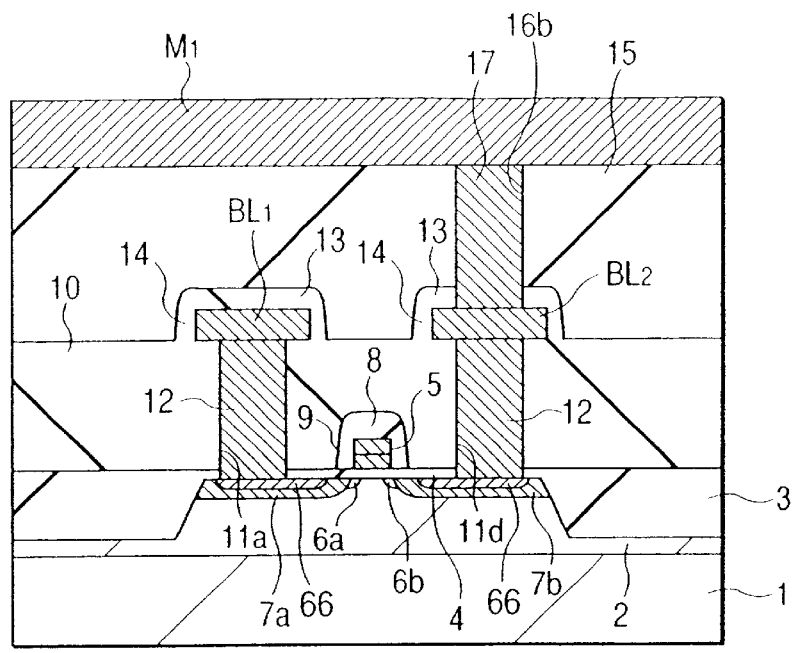
FIG. 6 is a diagram showing a top view of main elements of a MISFET on a semiconductor substrate as implemented by another embodiment of the present invention.

FIG. 6 is a cross-sectional diagram showing main elements of a semiconductor substrate for creating an n-channel MISFET of the logic portion as implemented by a second embodiment of the present invention.

Much like the n-channel MISFET implemented by the first embodiment, as shown in FIGS. 1 to 3, the conductive film $BL_1$ is connected to the $n^+$-type semiconductor area 7a serving as a portion of the source of the n-channel MISFET through the first contact holes 11a to 11c and, at the same time, shunts the $n^+$-type semiconductor area 7a serving as the portion of the source through the plugs 12 inside the first contact holes 11a to 11c. On the other hand, the conductive film $BL_2$ is connected to the $n^+$-type semiconductor area 7b serving as a portion of the drain of the n-channel MISFET through the second contact holes 11d to 11f and, at the same time, shunts the $n^+$-type semiconductor area 7b serving as the portion of the source through the plugs 12 inside the second contact holes 11d to 11f.

In addition, in the case of the second embodiment, a silicide layer 66 with a film thickness of about 15 to 20 nm is created on the surface of the $n^+$-type semiconductor area 7a serving as the portion of the source of the n-channel MTSFET. Similarly, a silicide layer 66 with a film thickness of about 15 to 20 nm is created on the surface of the $n^+$-type semiconductor area 7b serving as the portion of the drain of the n-channel MISFET.

In this way, according to the second embodiment, the silicide layers 66, each having a low resistance, are created on the surfaces of the $n^+$-type semiconductor areas 7a and 7b serving as the portions of the source and the drain of the n-channel MISFET, respectively, allowing the parasitic resistance to be reduced and, hence, the operating characteristic of the MISFET to be improved.

In addition, in order to improve the characteristic of matching a shallow junction between the source and the drain as described above, even in the case of a silicide layer with a thickness reduced to a value in the range 15 to 20 nm, by creating the thin silicide layer on an active layer in advance, it is possible to reduce the contact resistances between the source/the drain and the plugs 46 and 12 which are made of a titan film, a titan-nitride film and a tungsten film arid to prevent the metallic elements composing the plugs 46 and 12 from spreading to the substrate.

Figure 8:
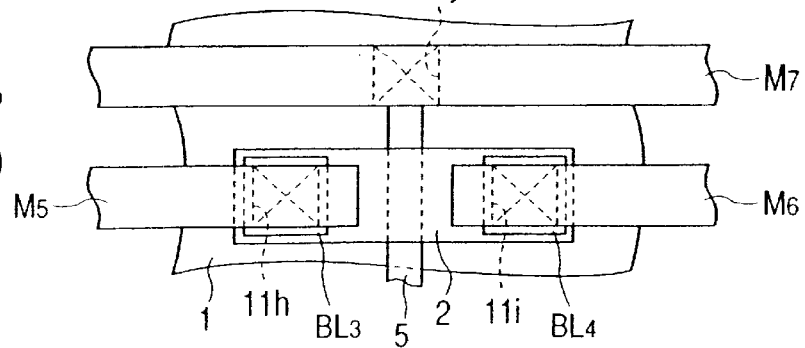
FIG. 8 is a diagram showing a top view of main elements on a semiconductor substrate of a MISFET studied by the inventor of the present invention.

By forming a plurality of separated contact holes and separated plugs for connecting the source and the drain of the MISFET of the logic portion to the conductive films for shunting the source and the drain, which is the case with the embodiments described above, the paths of the contact holes for the source and the drain can be gathered in a narrow area as shown in FIG. 8, and inconveniences can thus be prevented from occurring in the formation of the contact holes and the plugs.

As described above, the present invention discovered by the inventor is exemplified concretely by embodiments implementing the features of the invention. It should be noted, however, that the scope of the present invention is not limited to the foregoing embodiments. It is needless to say that a variety of changes and modifications can be made to the embodiments described herein as long as the changes and the embodiments fall within a range not deviating from the essentials of the present invention.

Effects of representative features of this invention as disclosed in this specification are described as follows.

According to the present invention, it is possible to reduce the source-drain parasitic resistance of a MISFET constituting a logic circuit of a logic-DRAM mixture semiconductor integrated circuit device and to prevent the operating characteristic of the semiconductor integrated circuit device from deteriorating.

What is claimed is:

1. A semiconductor integrated circuit device comprising:
    a first area having a memory cell including:
        a first MISFET having first semiconductor areas of a source and a drain and a first gate electrode; and
        a capacitive element electrically connected to a particular one of said first semiconductor areas of a source and a drain;
        a bit line electrically connected to the other one of said first semiconductor areas of a source and a drain, wherein said capacitive element is formed over the bit line;
    a second area including a logic circuit including:
        a second MISFET having second semiconductor areas of a source and a drain and a second gate electrode; and
    a first insulation film created over said first MISFET and said second MISFET over which the following elements are provided:
        a first contact hole formed on said first insulation film over a particular one of said second semiconductor areas of a source and a drain;
        a second contact hole formed on said first insulation film over the other one of said second semiconductor areas of a source and a drain;
        a first conductive film created on the same layer as said bit line and electrically connected to said particular one of said second semiconductor areas of a source and a drain through said first contact hole in order to shunt said particular one of said second semiconductor areas of a source and a drain; and
        a second conductive film created on the same layer as said bit line and electrically connected to said other one of said second semiconductor areas of a source and a drain through said second contact hole in order to shunt the other one of said second semiconductor areas of a source and a drain.

2. A semiconductor integrated circuit device according to claim 1, wherein said bit line and said first and second conductive films are comprised of tungsten film.

3. A semiconductor integrated circuit device according to claim 1, wherein said first conductive film is comprised of two portions.

4. A semiconductor integrated circuit device according to claim 2, wherein said first conductive film is comprised of two portions.

* * * * *